United States Patent
Makino (10) Patent No.: US 8,284,584 B2
(45) Date of Patent: Oct. 9, 2012

(54) SEMICONDUCTOR INTEGRATED CIRCUIT DEVICE AND METHOD OF ARRANGING WIRINGS IN THE SEMICONDUCTOR INTEGRATED CIRCUIT DEVICE

(75) Inventor: Eiichi Makino, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 682 days.

(21) Appl. No.: 12/426,444

(22) Filed: Apr. 20, 2009

(65) Prior Publication Data

US 2009/0261386 A1  Oct. 22, 2009

(30) Foreign Application Priority Data

Apr. 21, 2008  (JP) .................................. 2008-109816

(51) Int. Cl.
*G11C 5/06* (2006.01)
(52) U.S. Cl. ........................... 365/63; 257/773; 257/776
(58) Field of Classification Search ........................ None
See application file for complete search history.

(56) References Cited

U.S. PATENT DOCUMENTS

| 5,534,732 | A | * | 7/1996 | DeBrosse et al. | ............. 257/776 |
| 5,661,676 | A | * | 8/1997 | Shiozawa | ......................... 365/63 |
| 6,166,940 | A | | 12/2000 | Ozeki | |
| 7,139,993 | B2 | * | 11/2006 | Proebsting et al. | ........... 257/776 |
| 7,219,323 | B2 | | 5/2007 | Makino | |
| 7,335,906 | B2 | * | 2/2008 | Toda | ................................ 257/2 |

FOREIGN PATENT DOCUMENTS

JP  2000-269447  9/2000

* cited by examiner

*Primary Examiner* — Alexander Sofocleous
(74) *Attorney, Agent, or Firm* — Oblon, Spivak, McClelland, Maier & Neustadt, L.L.P.

(57) ABSTRACT

A semiconductor integrated circuit device includes a first component, a second component, a plurality of first, second and third contacts, and a plurality of signal lines having a plurality of first wires, and connecting the first and second component, each of the first wires having a first, second, third and fourth part, each of the parts having a resistivity, the second part having a first resistivity, a different value of the first resistance being set for each of the plurality of first wires, the first, third and fourth parts having a second or third resistivity which is lower than the first resistivity, the first and second part being electrically connected in series by the first contact, the second and third part being electrically connected in series by the second contact, and the third and fourth part being electrically connected in series by the third contact.

14 Claims, 8 Drawing Sheets

| Wiring width (W) (μm) | Interval between adjacent wires (S) (μm) | | (A) Capacitance between adjacent wires (fF/μm) | Other capacitance (fF/μm) | (B) Total capacitance (fF/μm) | Improvement rate of capacitance between adjacent wires (b)/(a) (%) | Improvement rate of total capacitance (b)/(a) (%) |
|---|---|---|---|---|---|---|---|
| 0.6 | (a) | 0.6 | 0.119 | 0.166 | 0.285 | 28.5 | 86.6 |
|  | (b) | 1.8 | 0.034 | 0.213 | 0.247 |  |  |
| 0.3 | (a) | 0.3 | 0.217 | 0.091 | 0.308 | 32.2 | 66.2 |
|  | (b) | 0.9 | 0.070 | 0.134 | 0.204 |  |  |

SEMICONDUCTOR INTEGRATED CIRCUIT DEVICE AND METHOD OF ARRANGING WIRINGS IN THE SEMICONDUCTOR INTEGRATED CIRCUIT DEVICE

CROSS REFERENCE TO RELATED APPLICATION

This application is based on and claims the benefit of priority from the prior Japanese Patent Application No. 2008-109816, filed on Apr. 21, 2008, the entire contents of which are incorporated herein by reference.

BACKGROUND OF THE INVENTION

1. Field of the Invention

The present invention is related to a semiconductor integrated circuit device and reducing wire delay and skew between wires in the semiconductor integrated circuit device which is arranged with signal wires such as a data bus or address bus which are comprised of a plurality of these wires.

2. Description of the Related Art

In recent years, there has been a tendency for a continuous reduction in wiring pitch with the progress of miniaturization in semiconductor integrated circuit devices, and a situation in which wire delay and skew between wires caused by a significant increase in the amount of capacitance coupling due to narrower spacing between wires and a significant increase in resistance due to a reduction in wire width can no linger be ignored. Since these lead to obstacles to high speed and a reduction in operation margins in a semiconductor integrated circuit device, rapid improvement is being demanded.

In order to reduce wire delay, a method is proposed as is shown in Japanese Laid Open Patent 2000-269447. However, even with this method it is difficult to significantly improve skew between wires without increasing layout size.

The present invention proposes a semiconductor integrated circuit device and a method of arranging wiring in the semiconductor integrated circuit device in which skew between wires can be reduced without increasing layout size while maintaining high speed.

BRIEF SUMMARY OF THE INVENTION

A semiconductor integrated circuit device according to an embodiment of the present invention includes a first component, a second component, a plurality of first contacts, a plurality of second contacts and a plurality of third contacts, and a plurality of signal lines having a plurality of first wires, and connecting the first component and the second component, each of the first wires having a first part, a second part, a third part and a fourth part, each of the parts having a resistivity, the second part having a first resistivity, a different value of the first resistance being set for each of the plurality of first wires, the first, the third and the fourth parts having a second or third resistivity which is lower than the first resistivity, the first part and the second part being electrically connected in series by the first contact, the second part and the third part being electrically connected in series by the second contact, and the third part and the fourth part being electrically connected in series by the third contact.

A semiconductor integrated circuit device according to an embodiment of the present invention includes a first component, a second component, a plurality of first contacts, a plurality of second contacts, a plurality of third contacts and a plurality of fourth contacts, and a plurality of signal lines having a plurality of first wires and a plurality of second wires and connecting the first component and the second component, each of the first wires having a first part, a second part, a third part and a fourth part, each of the second wires having a fifth part and a sixth part, each of the parts having a resistivity, the second part having a first resistivity, a different value of the first resistance being set for each of the plurality of first wires, the first, the third, the fourth, the fifth and the sixth parts having a second or third resistivity which is lower than the first resistivity, the first part and the second part being electrically connected in series by the first contact, the second part and the third part being electrically connected in series by the second contact, the third part and the fourth part being electrically connected in series by the third contact, and the fifth part and the sixth part being electrically connected in series by the fourth contact, a length of the plurality of first wires being the sum of a wire length of the first part from an end of the first component side of the first part up to the first contact, a length of the first contact, a wire length of the second part from the first contact up to the second contact, a length of the second contact, a wire length of the third part from the second contact up to the third contact, a length of the third contact, and a wire length of the fourth part from the third contact up to an end of the second component side of the fourth part, the plurality of first wires being arranged in odd numbered positions from a certain position in order from the shortest length, and a length of the plurality of second wires being the sum of a wire length of the fifth part from an end of the first component side of the fifth part up to the fourth contact, a length of the fourth contact, a wire length of the sixth part from the fourth contact up to an end of the second component side of the sixth part, the second wires being arranged in even numbered positions from the certain position in order from the longest length.

A method of forming a plurality of signal lines of a semiconductor integrated circuit device according to an embodiment of the present invention includes forming a first component and a second component, forming a plurality of first parts, a plurality of second parts, a plurality of third parts and a plurality of fourth parts with a plurality of wires, forming a plurality of the second parts with a material having a first resistivity so that a resistance value of each the first resistivities of each second part of the plurality of second parts is different, forming a plurality of the first parts with a material having a second resistivity or a third resistivity which is lower than the first resistivity and connecting the plurality of first parts with the first component, forming a plurality of the fourth parts with a material having the second resistivity or the third resistivity and connecting the plurality of fourth parts with the second component, a length of each of the plurality of fourth parts being different, forming a plurality of the third parts with a material having the second resistivity or the third resistivity, a length of each of the plurality of third parts being different, electrically connecting in series the plurality of first parts and the plurality of second parts by a plurality of first contacts respectively and the plurality of third parts and the plurality of fourth parts by a plurality of third contacts respectively, electrically connecting in series the plurality of second parts and the plurality of third parts by a plurality of second contacts respectively, a distance between the plurality of first contacts and the plurality of second contacts on the plurality of second parts respectively being different, and forming the plurality of signal lines with the plurality of first, second, third and fourth parts, a length of each of the plurality of signal lines being the sum of a wire length of the first part from an end of the first component side of the first part up to the first contact, a length of the first contact, a wire length of the second part from the first contact up to the second contact, a length of the second contact, a wire length of the third part from the second contact up to the third contact, a length of the third contact, a wire length of the fourth part from the third contact up to an end of the second component side of the fourth part, the plurality of signal lines connecting the first component with the second component.

DETAILED DESCRIPTION OF THE INVENTION

The embodiments of the present invention will be explained below while referring to the diagrams. Furthermore, because the same symbols have been attached to the same structural elements throughout the embodiments, some explanations of these structural elements will be omitted to avoid repetition.

First Embodiment

As stated above, there is a tendency for a continuous reduction in wiring pitch with the progress of miniaturization in semiconductor integrated circuit devices. Here, when an electrical signal transverse a wire a delay occurs. This is known as wire delay. This wire delay is determined by the product of wire resistance and wire capacitance (this is usually referred to as RC or CR and will be referred to as CR in the description of the present invention). Therefore, as a result of the progress of miniaturization stated above, a situation arises in which wire resistance increases due to a reduction in wire width while capacitance between wires increases due to a reduction in wire pitch causing wire delay which can not be ignored.

In addition, in order to secure high speed and an operation margin in the semiconductor integrated circuit device it is essential that data skew be reduced between wires, and, for example, because there is a tendency for the number of memory cells which are read at once to increase due to demands for large scale capacity, it is even more important that data skew between wires be reduced. Particularly, because a signal wire such as a data bus or address bus in the semiconductor integrated circuit device is comprised of a plurality of wires, demands for a reduction of data skew between wires are increasing.

(Structure of a Data Bus in the Semiconductor Integrated Circuit Device)

Figure 1:
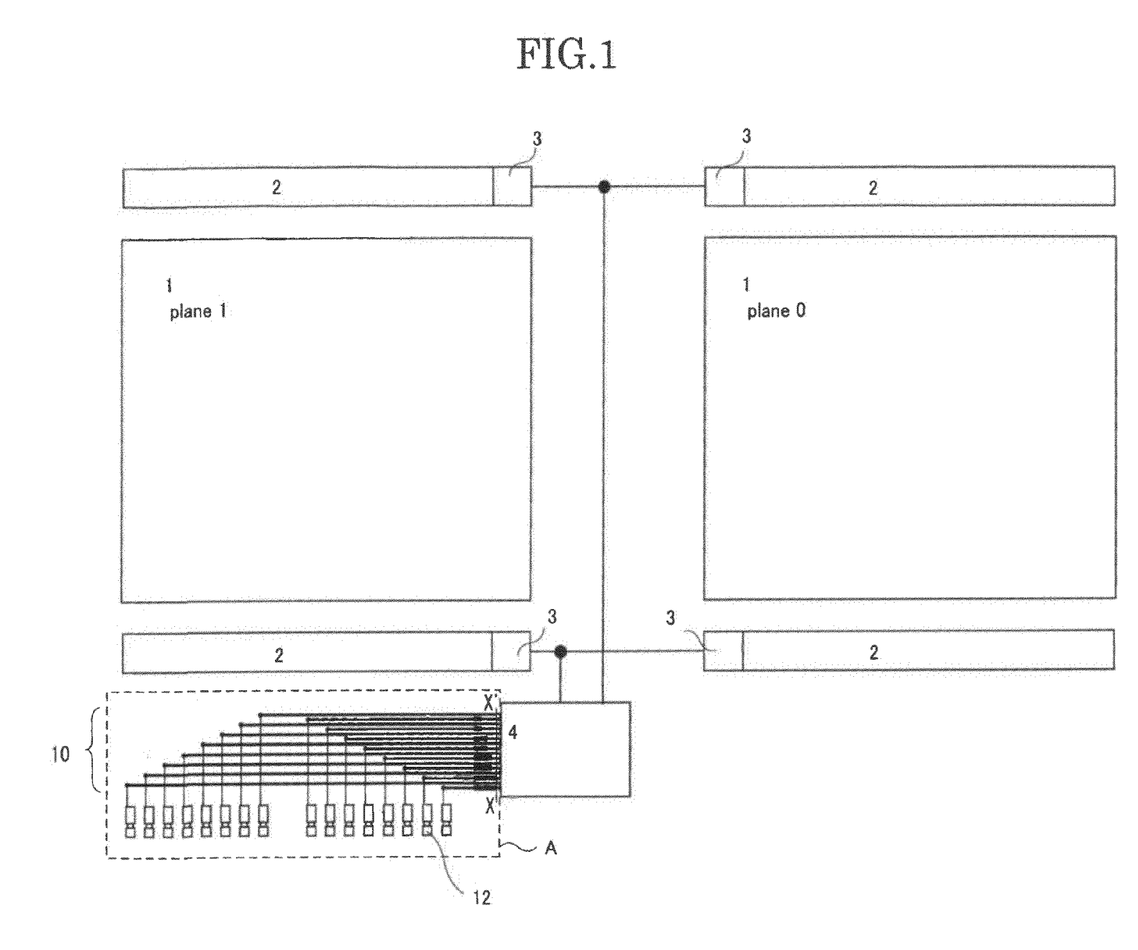
FIG. 1 is an outline diagram of a data bus of a semiconductor integrated circuit device related to one embodiment of the present invention.
Figure 2:
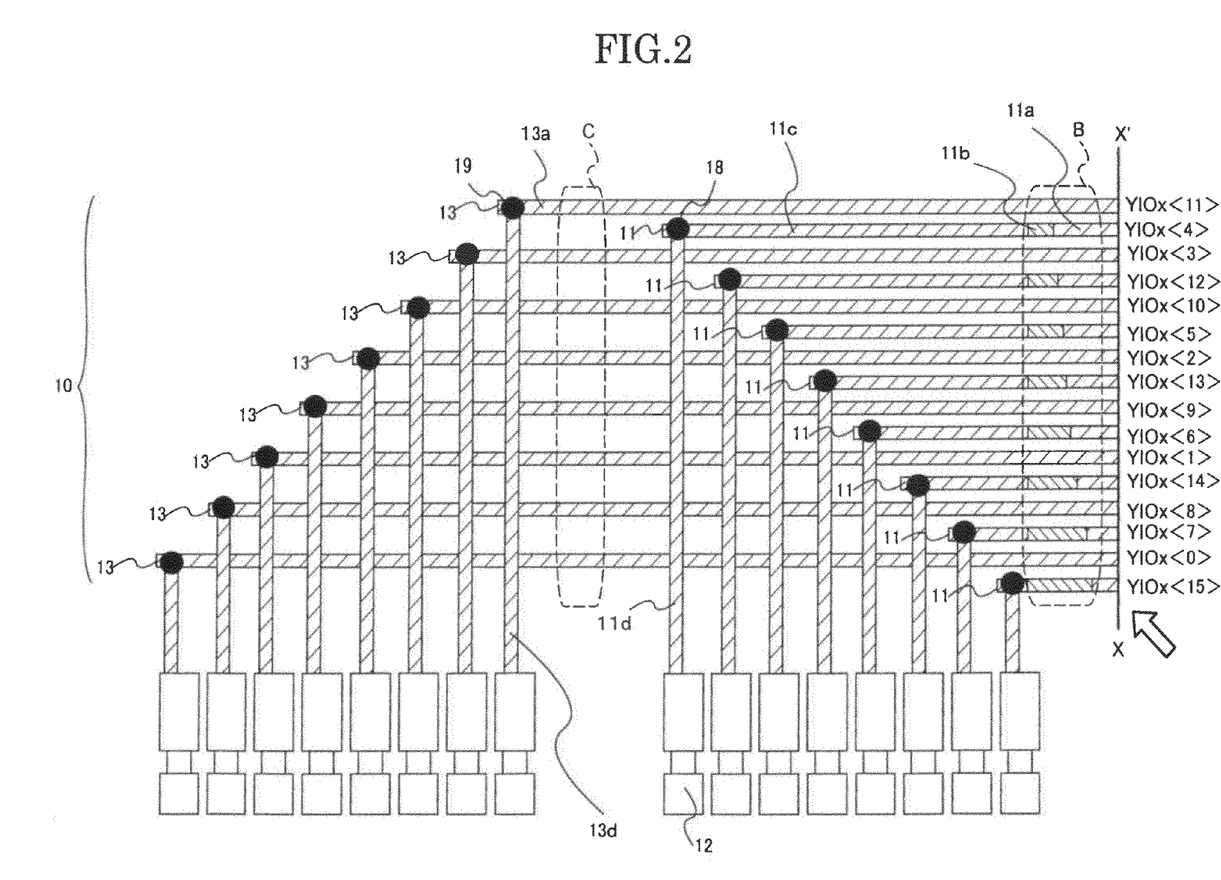
FIG. 2 is diagram of an enlarged view of the part A in FIG. 1.

FIG. 1 is an outline diagram of a data bus of a semiconductor integrated circuit device related to one embodiment of the present invention. FIG. 2 is diagram of an enlarged view of the part A in FIG. 1. Furthermore, while the semiconductor integrated circuit device related to the embodiment is explained here using a NAND type flash memory, the semiconductor integrated circuit device related to one embodiment of the present invention is not limited to a NAND type flash memory. While there are signal wire comprised of a plurality of wires such as a data bus or address bus as stated above, in the explanation of this embodiment below a data bus which connects a data buffer which is a first component and an external input/output terminal which is a second component is used as an example. However, the present embodiment is not limited to a data bus, it can be applied to all signal wires. Furthermore, while the first component and second component below refer to structural elements of the semiconductor integrated circuit device which are connected by a signal wire such as the data buffer or external input/output terminal they are not limited to this.

The semiconductor integrated circuit device includes a plurality of memory cell arrays each of which comprised of a plurality of electrically reprogrammable memory cells which are arranged in the shape of a matrix respectively. In FIG. 1, the memory cell array of the semiconductor integrated circuit device is illustrated as an example and two memory cell arrays 1, plane 0 and plane 1 are shown.

Each of the memory cell arrays 1 are connected to a sense amplifier (S/A) 2 via a bit line (not shown in the diagram). Each memory cell is connected to a bit line via a sense amplifier 2 and data is read out. A column decoder 3 which selects a column is attached to the sense amplifier 2. In addition, a column gate (not shown in the diagram) which selects a column is attached to the sense amplifier 2 and the column decoder 3 receives address data provided from an address circuit and controls the column gate. That is, the column decoder 3 is connected to a column selected by the column decoder 3 and a data bus 10 via a data buffer 4 and transmits reading data and programming data.

A sense amplifier 2a is arranged above the memory cell array 1 of plane 0 in FIG. 1 and a sense amplifier 2b is arranged below the memory cell array 1. The sense amplifiers 2 are connected to each bit line. Similarly, sense amplifiers 2c and 2d are arranged above and below the memory cell array 1 of plane 1.

Transmission and reception of data between each sense amplifier 2a to 2d and a plurality of external input/output (I/O) terminals 12 are performed via the data bus 10 and the data buffer 4. Therefore, a wire is connected between each sense amplifier 2a to 2d and the data buffer 4. In FIG. 1, sense amplifier 2a and sense amplifier 2c are connected to the data buffer 4 via a common wire and sense amplifier 2b and sense amplifier 2d are connected to the data buffer 4 via a common wire.

The data bus 10 is connected between the data buffer 4 and the plurality of external input/output terminals 12. The data bus 10 is comprised from a first wire 11 which includes a plurality of first resistivities and each of the first wires 11 is connected to each of the external input/output terminals 12.

Characteristically, the part A which is shown enclosed by the dotted line in FIG. 1 illustrates a wire structure of the semiconductor integrated circuit device related to one embodiment of the present invention. That is, the data bus 10 of the semiconductor integrated circuit device related to one embodiment of the present invention is formed from a plurality of first wires 11 and a plurality of second wires 13.

Next, FIG. 2 will be referred to in order to explain in more detail. The data bus 10 of the semiconductor integrated circuit device related to one embodiment of the present invention has sixteen wires comprised of eight first wires 11 and eight second wires 13. Because data is transferred in one byte (eight bits) units between the sense amplifier 2 and the external input/output terminal 12, a data bus 10 (a sixteen bit wide data bus) comprised of sixteen wires from YIOx <0> to YIOx <15> is used. Below, for the purposes of explanation, a data bus (a sixteen bit wide data bus) comprised of sixteen wires is explained as an example, however, the first wires 11 and the second wires 13 are not limited to eight wires each, and the data bus 10 is also not limited to sixteen wires. The present embodiment is also applicable to a thirty-two bit wide data bus, for example, and the number of wires which comprise the data bus is not limited. In addition, the second wires 13 are not always required in the present embodiment and the data bus may include only of a plurality of the first wires 11.

The eight first wires 11 of the data bus 10 related to the present embodiment are comprised of a first part 11a, a second part 11b, a third part 11c and a fourth part 11d, the second part 11b includes a first resistivity which is a high resistivity, the first part 11a the third part 11c and the fourth part 11d include a second or a third resistivity which are lower than the first resistivity. The first part 11a, the second part 11b and the third part 11c are each electrically connected in series. In addition, the eight second wires 13 are comprised of a fifth part 13a and a sixth part 13d and each part includes the above stated second or third resistivity. The fourth part 11d of the first wires 11 and the sixth part 13d of the second wires 13 are electrically connected to the third part 11c and the fifth part 13a respectively via a third contact 18 and a fourth contact 19. In addition, the third part 11c and the second part 11b of the first wires 11 are electrically connected via a second contact 17 (not shown in the diagram) at the end part of a first component (I/O buffer 4) side of the third part 11c. Furthermore, the second part 11b and the first part 11a of the first wires 11 are electrically connected via a first contact 14 (not shown in the diagram) at the end part of a second component (external input/output terminal 12) side of the first part 11a. As stated above, the first wires 11 which are connected via the first contact 14, the second contact 17 and the contact 18 become wires which have a high resistivity part (second part 11b) in one part. The second wires 13 which are connected via the fourth contact 19 are wires which do not have a high resistivity part. In FIG. 2, wires YIOx <4> to YIOx <7> and YIOx <12> to YIOx <15> which are first wires 11 include the first part 11a, the second part 11b, the third part 11c and the fourth part 11d. The wires YIOx <0> to YIOx <3> and YIOx <8> to YIOx <11> which are second wires 13 do not include a part equivalent to the second part and the third part of the first wires 11 but are comprised from the fifth part 13a and the sixth part 13d. Furthermore, the first contact 14 and the second contact 17 which connect the first part 11a with the second part 11b and the second part 11b with the third part 11c of the first wires 11 are not shown in the diagram. In addition, as will be stated below, the first contact 14 and the second contact 17 are both formed in the manufacturing process so that two contacts which connect different layers are connected in series, however, in the description of the present invention, the first contact 14 and the second contact 17 are each formed as one complete unit connected in series. Furthermore, in the present embodiment, the first part 11a and the third part 11c of the first wires 11 and the fifth part 13a of the second wires 13 are formed on the layer M2 while the fourth part 11d of the first wires 11 and the sixth part 13d of the second wires 13 are formed on the layer M1. Parts which are formed on the same layer have the same resistivity (either the second resistivity or the third resistivity), however, each resistivity may be the same (that is, the second resistivity and the third resistivity are the same). In addition, the layers in which each part is formed are not limited to this.

Then, in the present embodiment, the first wires 11 and the second wires 13 are arranged alternately. In FIG. 2, the first wires 11 are the wires YIOx <4> to YIOx <7> and YIOx <12> to YIOx <15>, and the second wires 13 are the wires YIOx <0> to YIOx <3> and YIOx <8> to YIOx <11>. In FIG. 2, it can be seen that the first wires 11 and the second wires 13 are arranged alternately. However, this is only an example and the arrangement sequence of the first wires 11 and the second wires 13 may be appropriately changed.

In addition, the arrangement of the plurality of first wires 11 and the arrangement of the plurality of second wires 13 is performed for each individual wire from a certain position and in a certain sequence according to the length of each wire. Here, the wire length of the first wires 11 is shown as the sum of the lengths, the wire length of the first part 11a from the end of the first component (data buffer 4 in FIG. 2) side of the first part 11a up to the first contact 14, the length of the first contact 14 (contact length), the wire length of the second part 11b from the first contact 14 up to the second contact 17, the length of the second contact 17, the wire length of the third part 11c from the second contact 17 up to the third contact 18, the length of the third contact 18, and the wire length of the fourth part 11d from the third contact 18 up to the end of the second component (external input/output terminal 12 in FIG. 2) side of the fourth part 11d. The wire length of the second wires 13 is shown as the sum of the lengths of the wire length of the fifth part 13a from the end of the first component (data buffer 4 in FIG. 2) side of the fifth part 13a up to the fourth contact 19, the length of the fourth contact 19, and the wire length of the sixth part 13d from the fourth contact 19 up to the end of the second component (external input/output terminal 12 in FIG. 2) side of the sixth part 13d. Furthermore, below, the length of a contact means the length from a connection point of one wire and a contact to a connection point of another wire and a contact where two wires are connected by a contact. In the present embodiment, the first wires 11 are arranged in an odd numbered position from a certain position in order from a short wire length and the second wires 13 are arranged in an even numbered position from a certain position in order from a long wire length. However, the wires are not limited to this arrangement. The first wires 11 may be arranged in an even numbered position from a certain position in order from a short wire length and the second wires 13 may be arranged in an odd numbered position from a certain position in order from a long wire length. Furthermore, although difficult to see in FIG. 2, in the present embodiment, the length of all the eight second wires 13 is all longer than the length of the eight first wires 11. In other words, among the sixteen wires which comprise the data bus 10, the eight wires which have a short wire length are first wires 11 and the eight wires which have a long wire length are second wires 13. In addition, as stated above, it is not always necessary to arrange the second wires 13, for example, the data bus 10 may be comprised of only the first wires 11 which have parts of a high resistivity and also arrange only one second wire 13. However, in either case, an increase in capacitance coupling between wires should be avoided and a wire with the longest length and a wire with the shortest length are arranged adjacent to each other.

As stated above, in FIG. 2, the eight first wires 11 and the eight second wires 13 are arranged alternately. Then, the first wires 11 are arranged in an odd numbered position from a certain position (the lower side of the side closest to the external input/output terminal 12) and the second wires 13 are arranged in an even numbered position from this certain position. Furthermore, the arrangement of each of the first wires 11 and the second wires 13 is performed according to a sequence decided in advance. That is, the first wires 11 are arranged from a certain position in order from a short wire length and the second wires 13 are arranged from this certain position in order from a long wire length.

In this way, arranging each of the first wires 11 and the second wires 13 according to the sequence stated above is to avoid arranging two wires with a long wire length adjacent to each other and thus to avoid an increase in capacitance coupling between adjacent wires, and furthermore, to adjust the capacitance between adjacent wires to about the same extent across all the wires.

Figure 5:
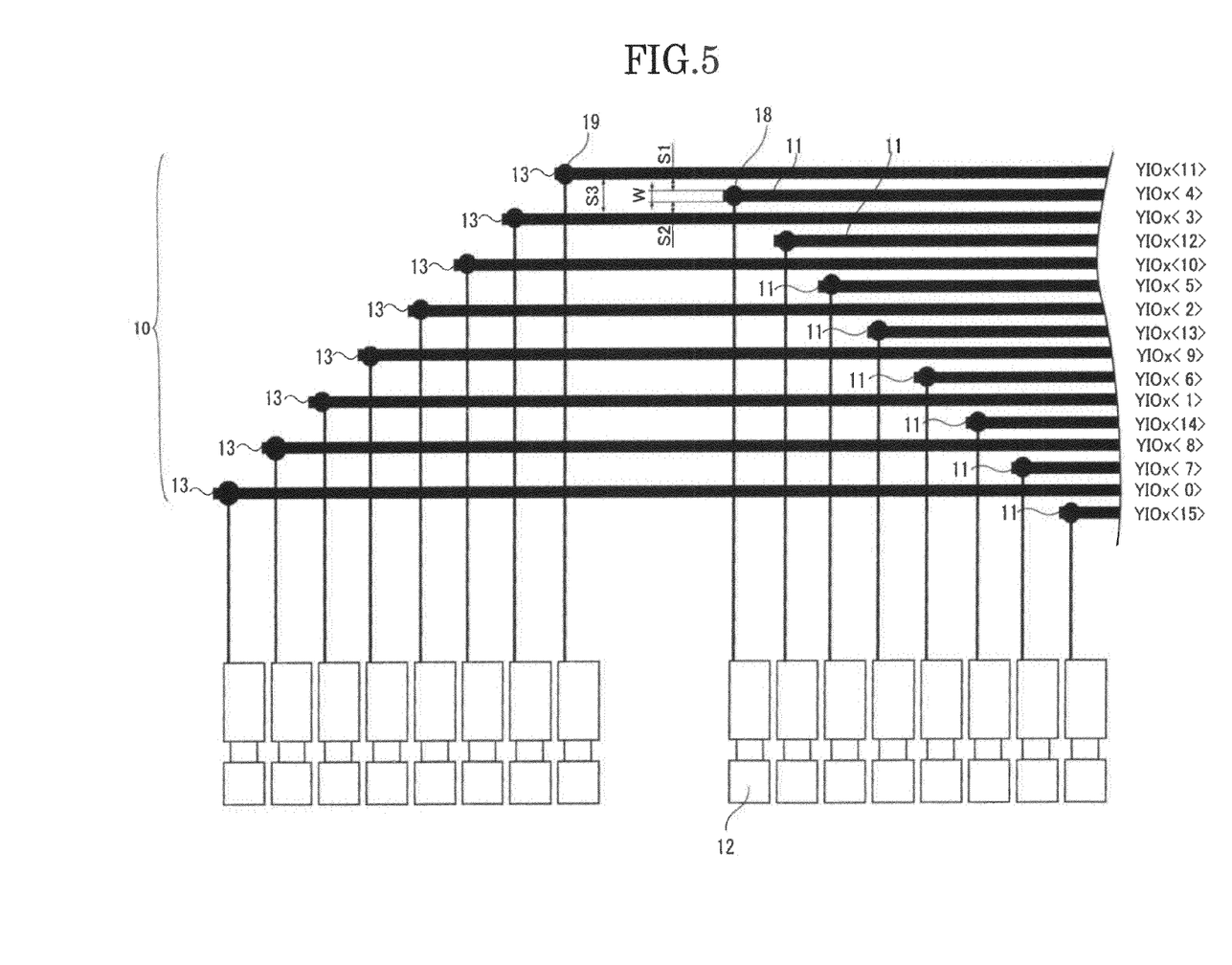
FIG. 5 is an outline diagram which shows the intervals between adjacent wires in the data bus of the semiconductor integrated circuit device related to one embodiment of the present invention.

Next, a more specific explanation will be made based on FIG. 2 and FIG. 5. FIG. 5 is an outline diagram which shows the intervals between adjacent wires in a data bus of the semiconductor integrated circuit device related to the first embodiment of the present invention. In a data bus, sixteen wires have the same structure and the parts equivalent to the first part of the first wires 11 and the fifth part of the second wires 13 stated above are formed to the same wire length. Then, the first or second component is connected via a contact by a wire equivalent to the fourth part 11d and the sixth part 13d in FIG. 2. However, according to the arrangement method of this type of data bus, the actual overall CR of a wire does not match. Therefore, in order to realize a high speed chip, the pitch (wire width and space between adjacent wires) of a wire must be increased which leads to an increase in layout size.

Thus, splitting adjacent wires which have a long wire length is considered. As an example, although not shown in the diagram, a method in which sixteen wires are split into two groups according to wire length and each group being arranged in a sequence according to wire length is considered. In this way, it is possible to approach the actual overall CR. However, even when wires are simply split, wires with a long wire length are sometimes adjacent to each other. In this case, high capacitance and high resistance can not be resolved in this area. Thus, in the data bus 10 of the semiconductor integrated circuit device related to the first embodiment of the present invention, as is shown in FIG. 2, the arrangement position of the sixteen wires which comprise the data bus 10 are adjusted according to the length of each wire. That is, wires are not split into two groups and wires which have a long wire length are split. In addition, in the present embodiment, capacitance coupling between adjacent wires is significantly improved by adopting a wire arrangement method in which the wire length and wire pitch are adjusted so that each capacitance coupling between adjacent wires comes close together.

Specifically, as is shown in FIG. 2, the sixteen wires are divided into two groups according to wire length. That is, the eight wires with a long wire length and eight wires with a short wire length are divided in order of wire length. The eight first wires 11 which have a short wire length are arranged in odd numbered position from a certain position (here, the external input/output terminal 12 side) and the eight second wires 13 which have a long wire length are arranged in even numbered positions from this certain position. Then, the first wires 11 which have a short wire length and are arranged in odd numbered positions are arranged in the following order: from the wire with the shortest wire length, the wire with the second shortest wire length, the wire with the third shortest length and so on. Then, the second wires 13 which have a long wire length and are arranged in even numbered positions are arranged in the following order: from the wire with the longest wire length, the wire with the second longest wire length, the wire with the third longest length and so on. Therefore, the wires are arranged from a certain position in the following order: the shortest wire (wire YIOx <15> in FIG. 2), the longest wire (wire YIOx <0> in FIG. 2), the second shortest wire (wire YIOx <7> in FIG. 2), the second longest wire (wire YIOx <8> in FIG. 2), the third shortest wire (wire YIOx <14> in FIG. 2), the third longest wire (wire YIOx <1> in FIG. 2). In other words, in the data bus of the semiconductor integrated circuit device related to the first embodiment of the present invention, the longest wire of the second wires 13 (wire YIOx <0>) is arranged between the shortest wire of the first wires 11 (wire YIOx <15> in FIG. 2) and the second shortest wire of the first wires 11 (wire YIOx <7> in FIG. 2), and the second longest wire of the second wires 13 (wire YIOx <8>) is arranged between the second shortest wire of the first wires 11 (wire YIOx <7>) and the third shortest wire of the first wires 11 (wire YIOx <14>).

Furthermore, from the top of the diagram as is shown in FIG. 5, when the interval between the first wire YIOx <11> (second wires 13) and the second wire YIOx <4> (first wires 11) is S1 and the interval between the second wire YIOx <4> (first wires 11) and the third wire YIOx <3> (second wires 13) is S2 and the width of all the wires is the same width W, the wire pitch (that is, wire pitch in which an adjacent wire interval is the same as a wire width) is set so that S1=W=S2. That is, the wire pitch of all the wires is made the same pitch as a wire width. By arranging the wires at a pitch so that the wire width and an adjacent wire interval becomes the same, if from the top of the diagram the interval between the first wire YIOx <11> (second wires 13) and the third wire YIOx <3> (second wires 13) is S3, then the wire pitch becomes S3=S1+W+S2=3W. In this way, in FIG. 5, because two second wires 13 which have a long wire length such as wire YIOx <0> and YIOx <8> actually become adjacent to each other in the part which exceeds the wire length of an adjacent first wire 11 which has a short wire length (wire YIOx <7> in FIG. 5) the wire pitch in this part becomes three times the size as stated above and therefore it is possible to reduce the effects of capacitance between adjacent wires.

Furthermore, the data bus 10 of the semiconductor integrated circuit device related to the first embodiment of the present invention includes first wires 11 which have a short wire length and part in which one part has a high resistivity (second part 11b) as stated above. It is possible to reduce wire delay due to capacitance between adjacent wires by the arrangement method of the first wires 11 and the second wires 13 which have different wire lengths as stated above. However, it is also necessary to reduce data skew between the wires. Thus, by arranging a part (second part 11b) which has a high resistivity on one part of the first wires 11 which have a short wire length, the transmission speed of data is adjusted and data skew between the second wires 13 which have a long wire length is reduced. As stated above, wire delay is determined by the sum of wire resistance and capacitance between wires. If wire height, width and material are the same, the wire resistance is proportional to the length of the wire. In the data bus 10 shown in FIG. 2, if wire height, width and material of the sixteen wires, wire YIOx <0> to YIOx <15>, is the same, the resistance becomes larger in proportion to each wire length. Therefore, if the wire height, width and material are the same, the resistance of each of the wires YIOx <0> to YIOx <15> is different, the amount of CR delay between the wire YIOx <0> which has the longest length and the wire YIOx <15> which has the shortest length becomes extremely large. Thus, in order to mutually bring the amount of CR delay between these wires close together, the parts (second part 11b) with a high resistivity are connected in series on the first wires 11 which have small wire resistance and short wire length, the total wire resistance of first wires 11 which have small wire resistance and short wire length is increased and is brought closer to the total wire resistance of the second wires 13 which have large wire resistance and long wire length. In FIG. 2, because the second part 11b which has the first resistivity which is a high resistivity is connected in series to the first part 11a, third part 11c, and fourth part 11d which have a second or third resistivity lower than the first resistivity of the first wires 11, the first wires 11 total wire resistance (entire wire resistance of the all the parts, first part 11a, second part 11b, third part 11c and third part 11d which are connected in series) becomes large. Therefore, it is possible to bring the first wires 11 total resistance closer to the total resistance of the second wires 13 which have a long wire length.

Here, a method of bringing the total wire resistance of the first wires 11 closer to the total wire resistance of the second wires 13 will be explained more specifically. If the height, width and material of the sixteen wires which each have a different length are the same, the total wire resistance is shown as sixteen values. That is, the distribution of the total wire resistance has a distribution width from the largest value of the total wire resistance to the sixteenth largest value (that is, the smallest value). Thus, eight wires in order from the wire with the shortest length (that is, first wires 11) are connected in series as a high resistivity part (second part 11b), the total wire resistance of these eight first wires 11 are adjusted to fit within the distribution width of the total wire resistance of the eight second wires 13 (the wires in part C shown enclosed by a broken line in FIG. 2). In this way the distribution width of the total wire resistance becomes half. Therefore, by bringing the total wire resistance of the sixteen wires closer together, the amount of CR delay also comes closer together, data skew between wires can be significantly reduced and it is possible to control a reduction in operation margins. In the present embodiment, the high resistivity part (second part 11b) is formed as wires which include a high resistivity on a layer different from a layer in which the first part 11a and third part 11c of the first wires 11 are formed and by connecting each of these by a second contact 17 and a third contact 18, closer total wire resistances can be realized.

If the total wire resistance value which is adjusted by connecting the high resistivity part (second part 11b) in series is within a threshold distribution of the total wire resistance value of the above stated second wires 13, it is possible to adjust any of the values and may be the same as the largest value or the smallest value of the total wire resistance value within this distribution. However, if a margin of error is considered it is preferred to set the value to a middle value of a distribution of the total wire resistance of the eight second wires 13 (that is, an average value of the total wire resistance of the eight second wires 13).

In addition, in the embodiments shown in FIG. 2 stated above, the high resistivity parts (second parts 11b) were connected in series to the eight first wires 11 which have the smallest wire length among the sixteen wires, however the present embodiment is not limited to this. For example, by making the total wire resistances of fifteen wires the same as a wire which has the largest total wire resistance, it also is possible to make the amount of CR delay almost the same. In addition, by connecting in series the high resistivity parts (second parts 11b) to all of the sixteen wires, it is also possible to make the amount of CR delay of all the wires almost the same. In other words, it is also possible to make all the sixteen wires first wires 11. To which wire the high resistivity parts are connected and bringing the amount of CR delay closer together is determined by a standard which is wire length, and the height, width, material and wire length of the wire which forms the high resistivity parts.

Figure 3:
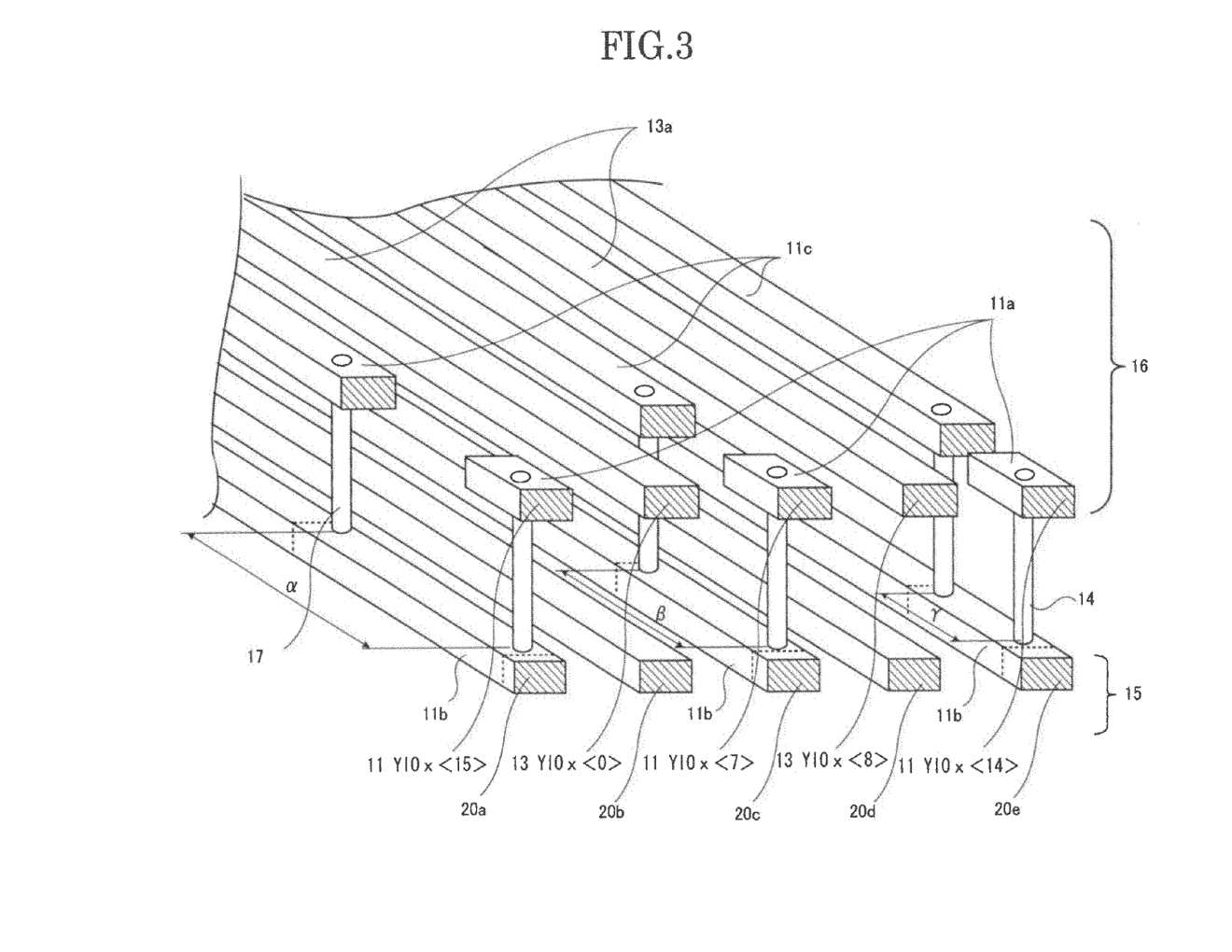
FIG. 3 is an outline three dimensional perspective view of the line X-X' of the data bus end part seen from the arrow direction shown in FIG. 2.

Next, a method of connecting the high resistivity parts (second parts 11b) to the first wires 11 will be explained. Because a planar structure of the data bus 10 is shown in FIG. 1 and FIG. 2, it is difficult to understand the method of connecting the high resistivity parts (second parts 11b) to the first wires 11. Thus, FIG. 3 will be used. FIG. 3 is an outline three dimensional perspective view of the line X-X' of the data bus end part seen from the arrow direction shown in FIG. 2. An insulation layer etc has been omitted in FIG. 3 for the purpose of explaining the connection state between wires. In addition, in order to more easily understand the connection relationships, only one part of the data bus 10 is shown.

As is shown in FIG. 3, a plurality of first wires 11 and second wires 13, are formed on different layers to the high resistivity parts (second parts 11b) which are connected to the first wires 11. That is, a plurality of high resistivity wires 20 (wires 20a-20e in FIG. 3) are formed in a layer 1 and first part 11 and second part 11c of the plurality of first wires 11 and a fifth part 13a of the plurality of second wires 13 (wire YIOx <15>, wire YIOx <0>, wire YIOx <7>, wire YIOx <8> and wire YIOx <14> in FIG. 3) is formed in a layer 2. The plurality of first wires 11 and second wires 13 are formed so that they are mutually parallel in a certain part. In other words, the plurality of first wires 11 and second wires 13 are formed so that each has a parallel part. In addition, the plurality of high resistivity wires 20 are also formed so that each has a parallel part. Then, the parallel parts of the plurality of first wires 11 and second wires 13 are arranged so that they face the parallel parts of the plurality of high resistivity wires 20. Furthermore, the first wires 11 are formed as two wires (first part 11a and third part 11c) which are connected by an interval at a certain position. Above this, the first part 11a and the third part 11c of the first wires 11, and the high resistivity wire 20 are each connected by a first contact 14 and a second contact 17. In this way, the high resistivity wire 20 between the first contact 14 and the second contact 17 is formed as a high resistivity part (second part 11b) of the first wires 11 and the first part 11a, second part 11b and third part 11c are electrically connected in series. More specifically, the first part 11a is connected to the high resistivity wire 20 via the first contact 14 at an end of the interval side of the first part 11a (that is, the side of the external input/output terminal 12 which is the second component) and the third part 11c is connected to the high resistivity wire 20 via the second contact 17 at and end of the interval side of the third part 11c (that is, the side of the data buffer 4 which is the second component). In this way, the high resistivity wire 20 is formed as the second part 11b of the first wire 11 between the first contact 14 and the second contact 17. In FIG. 3, the high resistivity wires 20a, 20c, 20e are respectively connected to each of the first wires YIOx <15>, YIOx <7> and YIOx <14> via the first contact 14 and the second contact 17 and respectively form the second part 11b of the first wires 11. The second wires 13, YIOx <0> and YIOx <8>, do not have an interval and are also not connected with a high resistivity wire 20. Furthermore, in FIG. 3, high resistivity wires 20 are formed facing all the first wires 11 and second wires 13 and the high resistivity wires 20 which only face the first wires 11 are connected, however, it is not limited to this. The high resistivity wires 20 are only connected to the first wires 11, but may be formed facing a corresponding first wire 11 and may be connected in series.

As is clear from FIG. 3, the intervals between the first contacts 14 and second contacts 17 which connect the first wires 11 (the wires YIOx <15>, YIOx <7> and YIOx <14> in FIG. 3) with opposing high resistivity wires 20 (20a, 20c, 20e in FIG. 3), are each different. That is, the interval α between the first contact 14 and the second contact 17 which connects the wire YIOx <15> with the high resistivity wire 20a, the interval β between the first contact 14 and the second contact 17 which connects the wire YIOx <7> with the high resistivity wire 20a, and the interval γ between the first contact 14 and the second contact 17 which connects the wire YIOx <15> with the high resistivity wire 20a are all different, and are set to α>β>γ. This is for brining the total wire resistance of these wires (wires YIOx <15>, YIOx <7>, YIOx <14>) closer together. That is, the length of these wires are each different, and because the wire YIOx <15> has the shortest length, and the length of the wire YIOx <7> and YIOx <14> gets longer in this order, this is for adjusting the amount of resistance which is increased by the wire length of the high resistivity wire 20, that is, the distance between the first contact 14 and second contact 17. The first wire 11 YIOx <15> which has the shortest length and therefore mostly requires an increase in the total wire resistance, increases the distance between contacts of the high resistivity wire 20a which is connected (that is, the wire length of the high resistivity wire 20a is made longer). As the wire length of a first wire 11 becomes longer, the distance between contacts of the high resistivity wire 20a becomes smaller (that is, the wire length of the high resistivity wire 20a is made shorter) and an adjustment is made to reduce the amount of resistance which increases.

According to an adjustment method of a resistance value of this type of high resistivity wire 20, it is possible to make the height, width and material of the high resistivity wire 20 the same and the wire formation process becomes easier. However, the adjustment method of a resistance value in the present embodiment is not limited to this. It is possible to appropriately make an adjustment with the wire width or material for example.

As explained above, in the data bus of the semiconductor integrated circuit device related to embodiment one of the present invention, a plurality of first wires 11 are formed by parts having a high resistivity (second part 11b) being electrically connected in series so that the total wire resistance increases. In this way, by bringing closer the total wire resistance of each of the wires (first wires 11 and second wires 13) which comprise the data bus 10 and brining closer the amount of CR delay, it is possible to reduce data skew between wires and also control a reduction in operation margins. Furthermore, in the data bus of the semiconductor integrated circuit device related to embodiment one of the present invention, by adopting a wire arrangement method in which adjacent wire capacitance between a wire having the longest length and a wire having the shortest length is minimized it is possible to reduce wire delay without increasing layout design.

Figure 4:
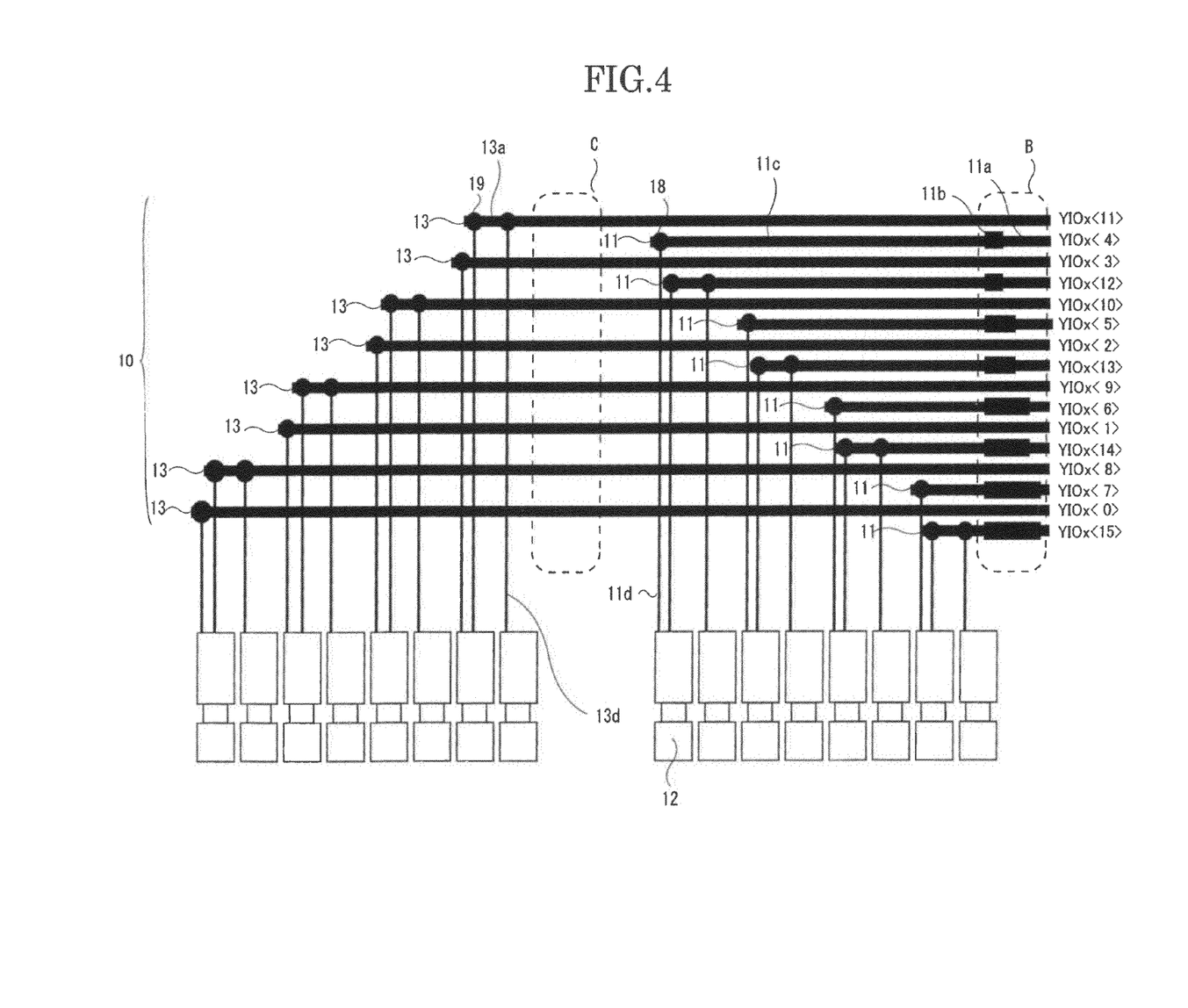
FIG. 4 is an outline diagram of a different example of the data bus of the semiconductor integrated circuit device related to one embodiment of the present invention.

Furthermore, the wiring arrangement method of the data bus 10 of the semiconductor integrated circuit device related to one embodiment of this invention is not limited to the wiring arrangement method which connects wires which comprise the data bus 10 one by one with the first component (I/O data buffer 4), and the second component (external input/output terminal 12). FIG. 4 is an outline diagram of a different example of the data bus of the semiconductor integrated circuit device related to one embodiment of the present invention. Furthermore, in FIG. 4, because the second part 11b of the first wire 11 is shown in a planar view, the wire width of the second part 11b is very wide. However, the actual wire width is the same as the other parts.

A specific first component (external input/output terminal 12) is sometimes connected to the data bus 10 of the semiconductor integrated circuit as is shown in FIG. 4 by different wires which comprises the data bus 10 in a 1:2 relationship. This is for achieving high speed data input/output by arranging a data input path and data output path as different paths. In this data bus 10, by the wiring arrangement method of the data bus 10 of the semiconductor integrated circuit device related to one embodiment of the present invention, it is possible to arrange a high resistivity part (second part 11b) in a first wire 11 which has the shortest wire length, arrange the first wires 11 and the second wires 13 alternately and arrange each of these wires in a certain sequence. In this way, it is possible to reduce wire delay, significantly reduce data skew between wires and control a reduction in operation margins without increasing layout size.

Furthermore, the high resistance wires are adjusted by the wire length of the second part between each of the first contact and second contact so that the resistance value of the second part becomes larger in order of, for example, the sum of the wire length of the first part from an end of the first component side up to the first contact, a length of the first contact, a wire length of the second part from the first contact up to the second contact, a length of the second contact, a wire length of the third part from the second contact up to the third contact, a length of the third contact, and the wire length of the fourth part from the third contact up to an end of the second component side of the plurality of first wires, and the resistance value of the plurality of first wires may be approximately the same as the average of the resistance values of each of the plurality of second wires.

[Manufacturing Method of a Data Bus of a Semiconductor Integrated Circuit Device]

A manufacturing method of a data bus of a semiconductor integrated circuit device related to the first embodiment of the present invention will be explained using FIG. 3. However, the manufacturing method explained below is only one example of a manufacturing method of a data bus of a semiconductor integrated circuit device related to the first embodiment of the present invention and is not limited to the embodiments of the present invention.

First, the number of first wires 11 which connect in series the high resistance parts (second parts 11b) and the desired total wire resistance value which should be brought close is determined based on the number, wire length, height and material of first wires 11 and the second wires 13 which comprise the data bus 10. Above this, the resistance value of each of the first wires 11 which should be increased is determined based on the wire length of each of the first wires 11. Then, the wire length (that is, the distance between the first contact 14 and second contact 17) of a high resistivity part (second part 11b) is determined to match the resistance value which should be increased. This type of data is created as layout data in the design stage of the semiconductor integrated circuit device using an EDA (Electronic Design Automation) tool via a DRC (Design Rule Checking) check, a LVS (Layout Versus Schematic) check or an ERC (Electronic Rule Check) check. An example of the formation of the sixteen first wires 11 and second wires 13 and sixteen high resistivity wires 20 is explained below.

The data bus of the semiconductor integrated circuit device related to the first embodiment of the present invention is formed based on the layout data stated above by a manufacturing method of the semiconductor integrated circuit device. First, sixteen high resistivity wires 20 are formed on a layer 0 (15) by a lithography method based on layout data. Polysilicon (poly Si) is preferably used as a material of the high resistivity wires 20, however, the material is not limited to this. Polysilicon (poly Si) is deposited to a certain film thickness using a CVD technique in a certain position at which the high resistivity wires 20 are formed.

Next, a resist is deposited using a spin coat technique in order to form a certain wiring pattern of the high resistivity wires 20.

When deposition of the resist is finished, the sixteen high resistivity wires 20 are patterned in the resist using an exposure technique. Here, the wire patterning is performed so that each wire becomes parallel in a certain place, in other words, so that the high resistivity wires 20 have a parallel part.

A dry etching technique is used with the resist pattern as a mask, a polysilicon film is processed, the resist pattern is removed using an ashing technique and the high resistivity wire 20 is formed.

After an interlayer insulation film is formed on the upper part of the high resistivity wire 20, a contact hole is formed based on the layout data in a certain position of the high resistivity wire 20 which is connected in series with the first wire 11. The contact hole is formed by a dry etching process for example but is not limited to this. In addition, the distance between two contact holes above each of the high resistivity wire 20 which are connected in series with the first wires 11 is formed so that it becomes a distance determined as layout data based on a resistance value which is increased in advance. Therefore, the distance between contact holes is formed so that each is different in different wires.

After forming the contact hole, for example, the contact hole is filled by a tungsten mask, planed using a CMP process and a first part of the first contact and a first part of the second contact are formed. Tungsten is only one example, and other materials may also be used.

Next, a fourth part 11d of the first wire 11 and a sixth part 13d of the second wire 13 are formed in the layer 1 above the interlayer insulation film in which the first part of the first contact and the first part of the second contact are formed based on the layout data. Furthermore, after forming an interlayer insulation film on an upper part, and a contact is formed on the upper part of the first part of the first contact and the upper part of the first part of the second contact which were formed by the process stated above and also at a certain position which connects the third part 11c and the fourth part 11d of the first wires 11 and the fifth part 13a and sixth part 13d of the second wires 13. The contact hole is filled with a tungsten film and the third contact 18, the fourth contact 19, and a second part of the first contact and the second part of the second contact are formed. In this way, the first part and second part of the first contact are connected, the first contact 14 is formed, and the second contact 17 is similarly formed. Furthermore, based on the layout data, the first part 11a and the third part 11c of the first wires 11 and the fifth part 13a of the second wires 13 are formed in the layer 2 (16) above the interlayer insulation in which these contacts are formed. Aluminum, an aluminum alloy, or copper etc is preferably used as a material of the first part 11a, the third part 11c, the fourth part 11d, the fifth part 13a and the sixth part 13d, but not limited to these.

An aluminum film is formed, for example, on the layer 2 (16) and the sixteen first wires 11 and the second wires 13 are formed by a photo etching process. Each of the first wires 11 and the second wires 13 are formed so that each is parallel in a certain position, that is, each of the sixteen first wires 11 and second wires 13 are formed so that they have a parallel part. In addition, each of the parallel parts of the sixteen first wires 11 and the second wires 13 are formed so that they face the parallel parts of each of the sixteen high resistivity wires 20 which are already formed. Furthermore, the parallel parts of the sixteen first wires 11 and second wires 13 are formed in the present embodiment so that each has a different wire length. Furthermore, the sixteen first wires 11 and second wires 13 are formed so that the first wires 11 are arranged in odd numbered positions from a certain position (the external input output terminal 12 side in the present embodiment) from the wire with the shortest wire length, then the second shortest wire, the third shortest wire etc, and the second wires are arranged in even numbered positions from the wire with the longest wire length (in other words, the sixteenth shortest wire), the second longest (in other words, the fifteenth shortest wire), the third longest (in other words, the fourteenth shortest wire). However, the present embodiment is not limited to this.

Specifically, a resist film is formed to a certain film thickness using a spin coat technique above an aluminum film. Next, a wire pattern is patterned in the resist film using an exposure technique based on the layout data. This wire pattern is formed so that the wire width (W) and intervals between adjacent wires (S) are the same. In addition, because the first wires 11 and the second wires 13 are formed so that they are alternately arranged, odd numbered wires from the external input output terminal which become the first wires 11 connected to the high resistivity wires 20 are patterned so that they have a certain opening at a certain place on the first wires 11. Therefore, the formed resist pattern becomes a wire pattern of two odd numbered wires which have a certain interval and a wire pattern of one even numbered wire.

Then, this resist pattern is used as a mask and an aluminum film is processed using a dry etching technique, and by removing the resist pattern using an ashing technique a desired wire is formed. A wire which connects the data bus with the first and second components is formed and the data bus 10 is formed by connecting via a contact.

In the data bus 10 which is formed, a first wire 11 positioned in an odd numbered position from the external input output terminal 12 side is formed as two wires which have an interval at a certain position at an end of the interval side between each wire the high resistivity wire 20 is electrically connected in series by the first contact 14 and the second contact 17. A second wire 13 positioned in an even numbered position from the external input output terminal 12 side is formed as one wire which does not have an interval at a certain position. In addition, the sixteen first wires 11 and the second wires 13 are formed so that the wire width (W) and interval between adjacent wires (S) are the same, and as shown in FIG. 2, S=W in the part B in which the first wires 11 and the second wires 13 are alternately arranged, and in the part C which exceeds the wire length of the eight first wires 11, only the eight second wires 13 are adjacent to each other and S=3W.

As stated above, according to the first embodiment of the present invention, a wire arrangement method of a signal wire of a semiconductor integrated circuit device is proposed in which a second part of a first wire having a first resistivity is formed in a first layer, and a first part and third part of this first wire having a second resistivity which is lower than the first resistivity are formed on a second layer so that the distance from the connection point between a first contact and a second contact up to a connection point between the second contact and the second part becomes a distance decided in advance based on the total wire resistance, and the first contact and the second contact are formed electrically connecting in series two contacts which connect different layers, the second part and the first part are each connected by the first contact, and the second part and the third part are each connected by the second contact.

Furthermore, a formation method of a data bus was explained in the manufacturing method stated above, however, the wire arrangement method of the semiconductor integrated circuit device related to the first embodiment of the present invention may also be used in the formation of other signal wires such as an address bus, for example, and in this case, because the formation process is the same as the data bus formation method described above, an explanation is omitted here.

[Effects of the Data Bus of the Semiconductor Integrated Circuit Device]

According to the present invention, a semiconductor integrated circuit device and a method of wire arrangement in the semiconductor integrated circuit device are proposed in which skew between wires can be significantly reduced while maintaining high speed and without increasing layout size.

In a signal wire such as a data bus or address bus formed by the manufacturing process explained above, because the total wire resistance of a short wire is increased by connecting in series high resistivity parts which have a higher resistivity than this wire via a contact within each signal line, it is possible to being the total CR of a plurality of wires having a short wire length and a plurality of wires having a long wire length close together. In this way, it is possible to significantly improve wire delay and skew between wires.

In addition, in the first embodiment of the present invention, because the total wire resistance is increased by connecting in series high resistivity parts it is not necessary to increase a charge/discharge current. It is possible to consider simply increasing wire capacitance as a method for bringing the amount of CR delay closer together, however, in this case, an increase in charge/discharge current is caused leading to defects in the semiconductor integrated circuit device. The semiconductor integrated circuit device related to the first embodiment of the present invention, because the amount of CR delay is brought closer together by increasing the total wire resistance, defects in the semiconductor integrated circuit device due to an increase in this type of charge/discharge current are not caused. That is, it is possible to bring the amount of CR delay closer together without causing defects in the semiconductor integrated circuit device due to an increase in charge/discharge current.

Furthermore, according to the present invention, because a high resistivity part is formed on a layer which is different to the layer on which a low resistivity wire part is formed, it is possible to improve skew between wires without increasing layout size.

In addition, because it is possible to change a resistance value of a high resistivity part which is connected in series to each low resistivity wire by the distance between two contacts which connects a high resistivity part and low resistivity wire, it is possible to effectively reduce data skew caused by the difference in wire lengths.

Figure 6:
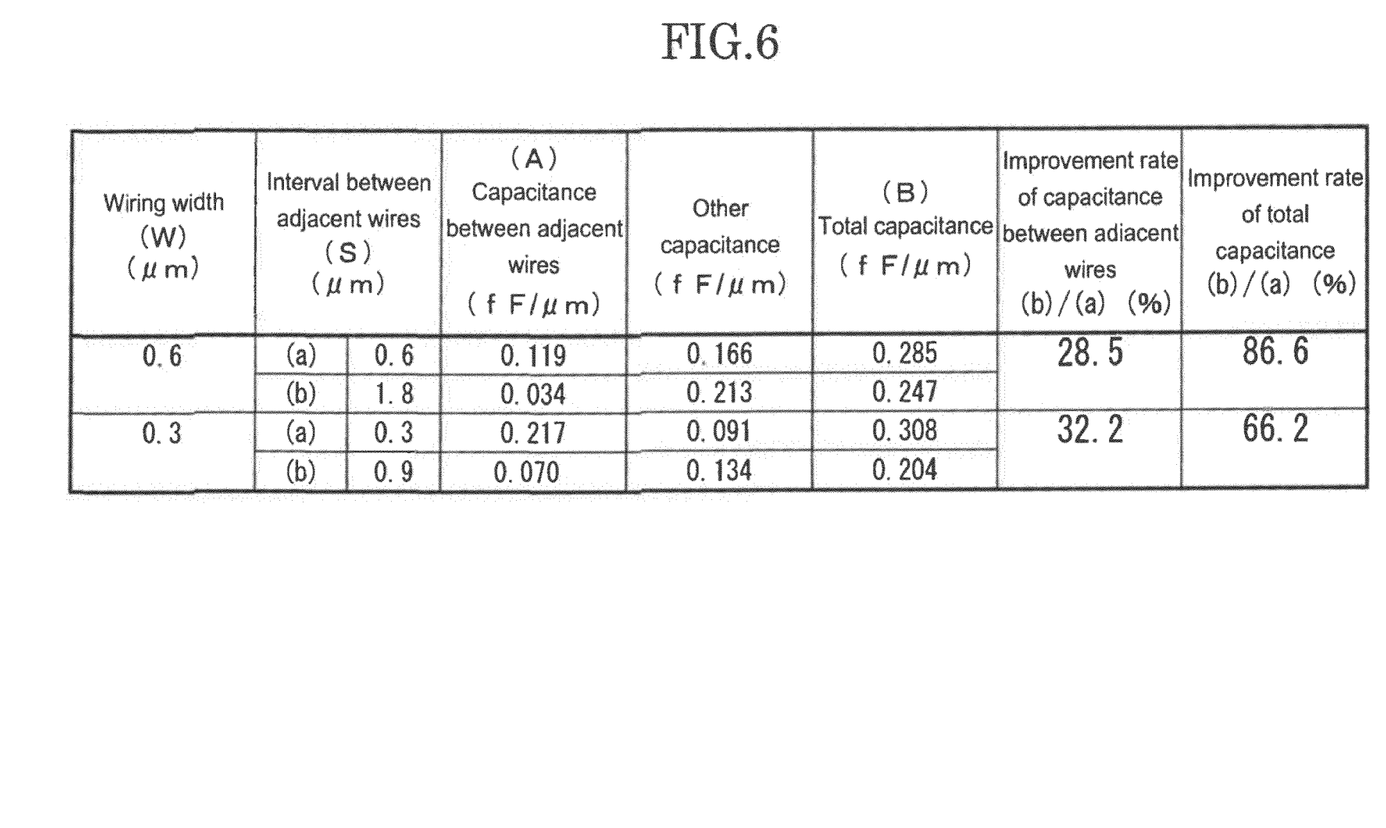
FIG. 6 is a diagram which shows the improvement rate due to the width of a wire of the data bus of the semiconductor integrated circuit device related to one embodiment of the present invention.

Furthermore, the effects of the arrangement of a signal wire in the semiconductor integrated circuit device related to the first embodiment of the present invention become more prominent the further miniaturization progresses in the semiconductor integrated circuit device. FIG. 6 will be explained. FIG. 6 is a diagram which shows the improvement rate due to the width of a wire of the data bus of the semiconductor integrated circuit device related to one embodiment of the present invention. The capacitance between adjacent wires and total capacitance due to the intervals between wires is shown in FIG. 6 in the case where the wire width of wires which comprise a signal wire such as a data bus or address bus is 0.6 µm and 0.3 µm. Here, the total capacitance is a sum of the capacitance between adjacent wires and other capacitance in wires other than capacitance between adjacent wires. In the setting of a wire width stated above, the capacitance when setting each interval between adjacent wires to an interval the same as the wire width and an interval three times the wire width is shown. Then, how much the capacitance between adjacent wires is improved when the interval between adjacent wires is the wire width (a) and when the interval between adjacent wires is three times the wires width (b) is expressed as a percentage.

In FIG. 6, when the case where the wire width is 0.6 µm and the case where the wire width is 0.3 µm are compared, in the case where the interval between adjacent wires is set three times the wire width, the capacitance between adjacent wires is improved in each wire by 28.5% and 32.2% respectively. The case where the improvement rate of capacitance between adjacent wires is wire width 0.6 µm is preferable. In the case of total capacitance, each improvement rate is significantly improved to 86.6% and 66.2% respectively, however, the improvement rate is large where the wire width is narrow. That is, the more narrow the wire width, the greater the improvement in total capacitance. More narrow layout design will be demanded as miniaturization continues to progress, however, the effects of the semiconductor integrated circuit device and wire arrangement method of a signal wire in a semiconductor integrated circuit device related to one embodiment of the present invention are more prominent the further this miniaturization progresses.

Furthermore, according to the wire arrangement method of a signal wire of the semiconductor integrated circuit device related to one embodiment of the present invention, it is possible to reduce skew between adjacent wires in a NAND type flash memory. That is, miniaturization in a NAND type flash memory is progressing and particularly in the size of a memory cell. In a pad arranged in one column or two columns, there is almost no progress in the reduction of pad pitch in a pad arrangement and the distance from pad end to the other pad end is long. Therefore, the wire length does not becomes shorter, and furthermore, because there is a tendency for a reduction in wire pitch, the problems of wire delay and skew between wires in a NAND type flash memory are serious, and the effects of the semiconductor integrated circuit device and wire arrangement method of a signal wire in a semiconductor integrated circuit device related to one embodiment of the present invention are large.

The semiconductor integrated circuit device and wire arrangement method of a signal wire in the semiconductor integrated circuit device related to one embodiment of the present invention was explained using a data bus of a NAND type flash memory between a data buffer and an external input output terminal as examples, however, the arrangement method of a signal wire in the semiconductor integrated circuit device related to one embodiment of the present invention may be applied to another data wire comprised of a plurality of wires or an address wire. For example, the arrangement method can also be applied to a data wire from a sense amplifier to a data buffer or an ECC (Error Checking and Correcting) circuit. In addition, the arrangement method can also be applied to semiconductor integrated circuit devices other than a NAND type flash memory.

A wire arrangement method of a signal wire in the semiconductor integrated circuit device and semiconductor integrated circuit device being applied this arrangement method related to one embodiment of the present invention were explained above, however, the present invention can also be applied to a data layout creation method in a semiconductor integrated circuit device and a layout data creation tool. An outline of a data layout creation method is explained below.

First, in the creation of layout data of a signal wire such as a data bus or address bus in a semiconductor integrated circuit, the total CR amount of each wire is calculated from the height, width, material and length of the wires which comprises the signal wire.

Next, in order to bring the total CR amount of each wire closer together, the wires which connect the high resistivity parts are decided. In this case, the total CR amount of all wires except one may be brought closer to this one wire, or the total CR amount of half of all the wires may be brought closer to a middle value of the remaining half. The layout creator decides in advance in what way the total amount of CR is to be brought closer together as a design rule based on the permitted wire transmission delay and skew between wires, and sets logic to a creation tool based on these design rules.

After the wires which connect the high resistivity parts in series are decided, the wire length of the high resistivity parts which are connected is decided based on the amount of CR which should be increased in each wire and the height and width of a wire of the high resistivity parts. Creation logic of the layout data may be set so that the distance between two contacts which are formed on the high resistivity wires is set as layout data.

According to the creation method of the above stated layout data and layout data creation tool, the layout of a signal wire in the semiconductor integrated circuit device in which wire delay and skew between wires is significantly improved without increasing layout size is complete.

Example 1

The wire arrangement method of a signal wire in a semiconductor integrated circuit device related to one embodiment of the present invention can also be applied to a semiconductor integrated circuit device other than a NAND type flash memory as stated above. Below, an example in which the arrangement method of a signal wire related to one embodiment of the present invention is applied to a RERAM (Resistance Random Access Memory) called a resistance change memory is explained.

In recent years, large capacity semiconductor integrated circuit devices are being demanded shown by significant development in multi-bit NAND type flash memory for example. Because RERAM can have a comparatively simple structure, small cell size and high density it is receiving particular attention especially since RERAM in which large capacity can be achieved by stacking memory cells in a three dimensional direction are being developed. Here, RERAM is a semiconductor integrated circuit device which utilizes the large change in electrical resistance (CMR: Colossal Magneto Resistance) caused by application of a voltage, has a small energy consumption due to reprogramming with a voltage, multi-bit programming is easy and read out time is fast.

Figure 7:
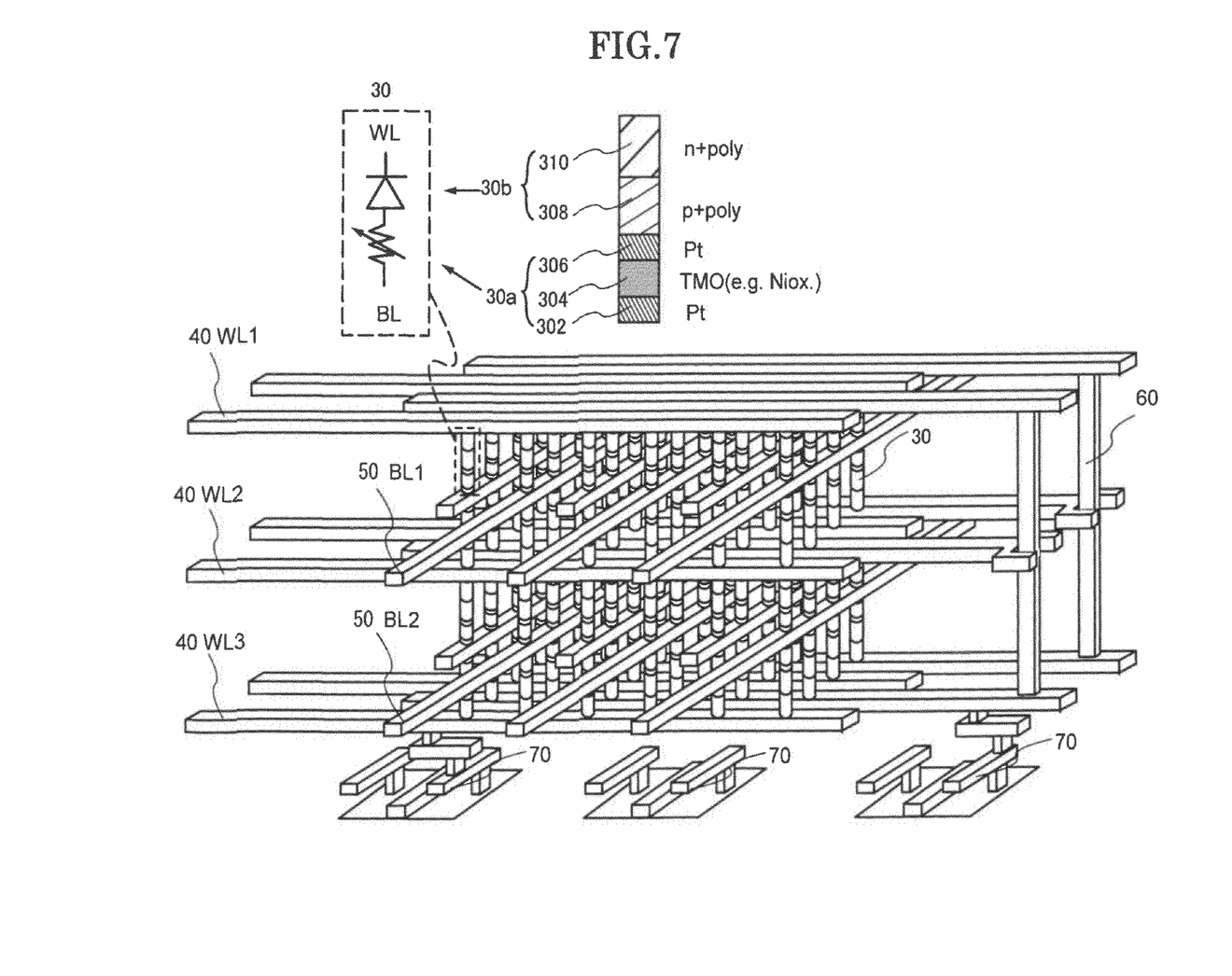
FIG. 7 is an outline structural view of a RERAM, a cross-sectional view of one cell and an equivalent circuit diagram related to one embodiment of the present invention.
Figure 8:
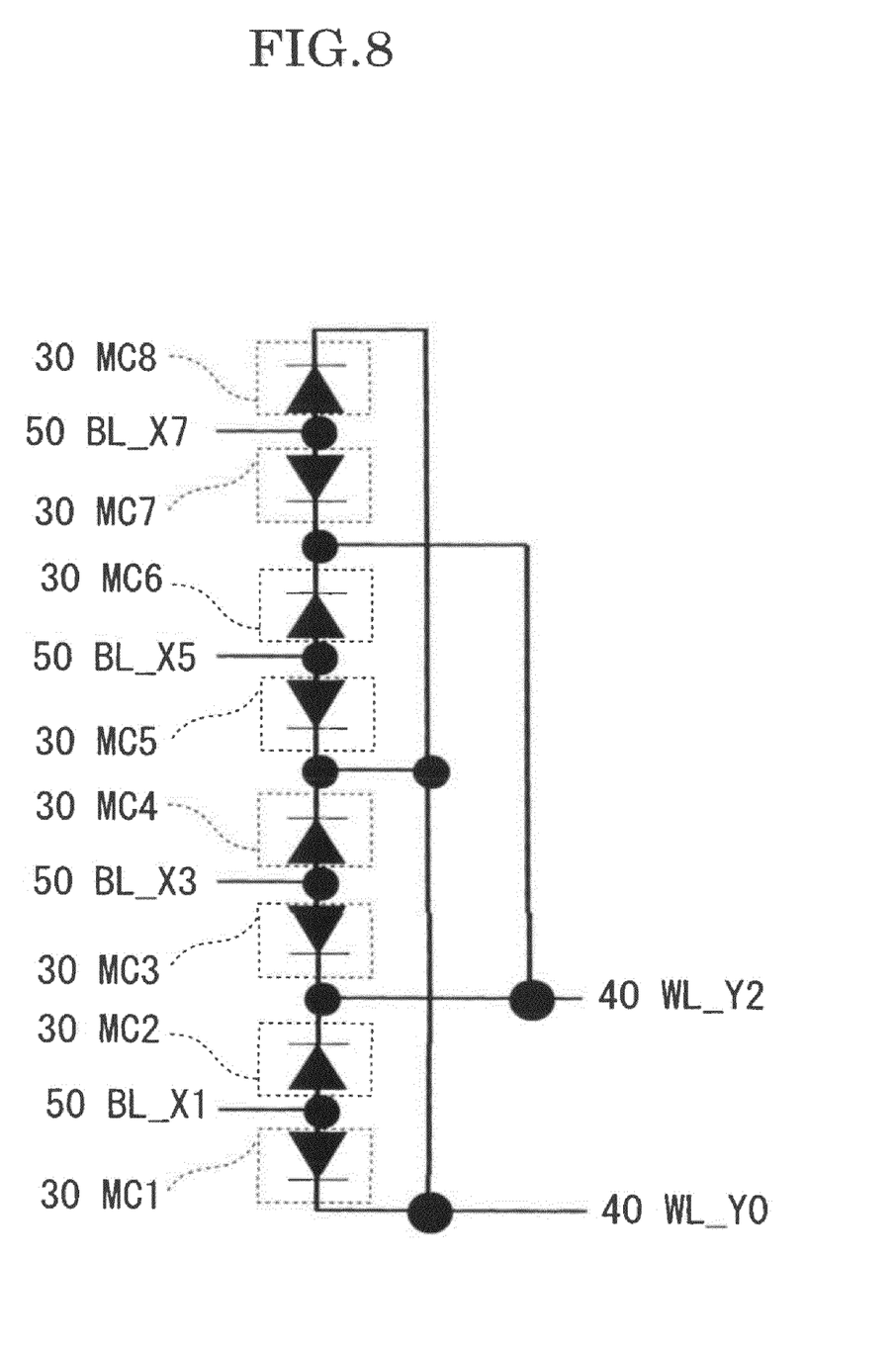
FIG. 8 is an equivalent circuit diagram of a memory cell array of a RERAM related to one embodiment of the present invention.

Next, FIG. 7 and FIG. 8 will be explained. FIG. 7 is an outline structural view of a RERAM, a cross-sectional view of one cell and an equivalent circuit diagram related to one embodiment of the present invention. FIG. 8 is an equivalent circuit diagram of a memory cell array of a RERAM related to one embodiment of the present invention. In FIG. 7, an example in which memory cells 30 are stacked on four layers is shown, however, the number of layers is not limited to four, for example, eight layers or sixteen layers are also possible. In addition, an equivalent circuit view is shown in FIG. 8 in the case where eight layers are stacked. As is shown in FIG. 7, one memory cell 30 of the RERAM is formed at the intersection of word line 40 and bit line 50 which are separated and intersect each other, and includes a structure in which a resistance change element 30a comprised of a metal layer 302, an oxide transition metal layer 304 and a metal silicide layer 306 is connected in series to a field-effect transistor (FET) comprised of a p type polysilicon layer 308 and an n type polysilicon layer 310 or a diode 30b. A transistor such as a word line drive circuit 70 is arranged on a layer M0 at the lower part of the RERAM and each word line 40 is connected by a Zia contact 60. A memory cell 30 is selected by applying a voltage to a word line 40 and a resistance value is changed by applying a voltage to a programming line and a bit line 50 and data is programmed. In FIG. 7, a RERAM is shown in which memory cells 30 are stacked in four layers in a three dimensional direction between the layers M1 and M2, however, each bit line BL1 and BL2 50 are connected respectively between two memory cells and word lines WL1, WL2, WL3 (40) for selecting a memory cell are connected as shown in FIG. 7. In the case where the memory cells are stacked in eight layers, as shown in the equivalent circuit view in FIG. 8, the four bit lines, BL_X1, BL_X3, BL_X5, BL_X7 (50) are each connected between two memory cells 30, the word line WL_Y0 (40) is connected between the fourth and fifth memory cells MC4, MC5 (30) and the lowest memory cell MC1 (30) and also connected in parallel with the highest memory cell MC8 (30), and the word line WL_Y2 (40) is connected between the second and third memory cells MC2, MC3 (30) from the bottom and also connected in parallel between the sixth and seventh memory cells MC6, MC7 (30). The four memory cells MC1, MC4, MC5, MC8 and four memory cells MC2, MC3, MC6, MC7 are simultaneously accessed in sets.

In a three dimensional RERAM having this type of structure, because memory cells 30 are stacked between the layer M1 and layer M2, the thickness between M1 and M2 becomes larger, contact resistance increases and the effects of wire resistance are even more pronounced. In addition, because memory cells 30 are formed above the layer M1, a copper wire can not be used in the layer M1 in the RERAM due to a relationship of a heat treatment after the memory cells 30 are formed. Therefore, in this point too, the effects of wire resistance are significant. Then, as stated above, in the three dimensional RERAM in which memory cells 30 are stacked in eight layers, because four layers of memory cells 30 are accessed simultaneously, the effects of wire delay become greater.

Thus, in a RERAM in which the effect of wire resistance is large, it is possible to apply the wire arrangement method of the semiconductor integrated circuit device related to one embodiment of the present invention described above to, for example, a data line which connects an I/O buffer and an external input output terminal, a data line which connects a column decoder of a sense amplifier and a data buffer, and a word line 40 which connects a sense amplifier and a memory cell array which includes a plurality of memory cells 30 formed using a resistance change material. As in the equivalent circuit view shown in FIG. 8, in the case of a RERAM in which resistance change memory cells are stacked in eight layers in a three dimensional direction, the word lines WL_Y0, WL_Y2 (40) are each connected to memory cells 30 of four layers and the memory cells 30 of four layers are simultaneously accessed at a time. However, because the wire length is different between the lowest memory cell MC1 (30) and the fourth, fifth memory cells MC4, MC5 (30) and the highest memory cell MC8 (30), when simultaneous access is attempted, wire delay occurs. Thus, by applying the wire arrangement method related to the first embodiment of the present invention described above to a word line 40 which is connected to each memory cell (30), it is possible to reduce wire delay. The total amount of wire capacitance which increases is appropriately calculated from a wires length for example.

In this way, the wire arrangement method related to one embodiment of the present invention can be applied to a RERAM wire and because the effects in this case are the same as stated in one embodiment above, an explanation is omitted here.

What is claimed is:

1. A semiconductor integrated circuit device comprising:
   a first component;
   a second component;
   a plurality of first contacts, a plurality of second contacts and a plurality of third contacts; and
   a plurality of signal lines having a plurality of first wires, and connecting said first component and said second component, each of said first wires having a first part, a second part, a third part and a fourth part, each of said parts having a resistivity, said second part having a first resistivity, a different value of said first resistivity being set for each of said plurality of first wires, said first, said third and said fourth parts having a second or third resistivity which is lower than said first resistivity, said first part and said second part being electrically connected in series by said first contact, said second part and said third part being electrically connected in series by said second contact, and said third part and said fourth part being electrically connected in series by said third contact.

2. The semiconductor integrated circuit device according to claim 1 further comprising:
   a plurality of fourth contacts; and
   said plurality of signal lines further having one or more second wires, each of said second wires having a fifth part and a sixth part, each of said parts having said second resistivity or said third resistivity respectively, said fifth part and said sixth part being electrically connected in series by said plurality of fourth contacts;
   wherein a length of said plurality of said first wires being the sum of a wire length of said first part from an end of said first component side of said first part up to said first contact, a length of said first contact, a wire length of said second part from said first contact up to said second contact, a length of said second contact, a wire length of said third part from said second contact up to said third contact, a length of said third contact, and a wire length of said fourth part from said third contact up to an end of said second component side of said fourth part and a length of said one or more said second wires being the sum of a wire length of said fifth part from an end of said first component side of said fifth part up to said fourth contact, a length of said fourth contact, a wire length of said sixth part from said fourth contact up to an end of said second component side of said sixth part, and shortest said first wires and longest said second wires being arranged adjacent to each other.

3. The semiconductor integrated circuit device according to claim 1, wherein said second part of said plurality of first wires are each formed on a first layer, and said first part and said third part of said first wires and said fifth part of said one or more second wires are each formed on a second layer which is different to said first layer.

4. The semiconductor integrated circuit device according to claim 1, wherein said first component is a data buffer and said second component is an external input terminal.

5. The semiconductor integrated circuit device according to claim 1, wherein said first component is a data buffer and said second component is a sense amplifier.

6. The semiconductor integrated circuit device according to claim 1, wherein said first component is an ECC circuit and said second component is a buffer or a decoder.

7. The semiconductor integrated circuit device according to claim 1, wherein said first component is a memory cell array including a plurality of memory cells each of which is formed using a resistance change material on intersections of one of a plurality of word lines and one of a plurality of bit lines, said word lines and said bit lines being mutually separated and intersect each other, said second component being a sense amplifier and said plurality of signal lines being said plurality of word lines.

8. A semiconductor integrated circuit device comprising:
   a first component;
   a second component;
   a plurality of first contacts, a plurality of second contacts, a plurality of third contacts and a plurality of fourth contacts; and
   a plurality of signal lines having a plurality of first wires and a plurality of second wires and connecting said first component and said second component, each of said first wires having a first part, a second part, a third part and a fourth part, each of said second wires having a fifth part and a sixth part, each of said parts having a resistivity, said second part having a first resistivity, a different value of said first resistivity being set for each of said plurality of first wires, said first, said third, said fourth, said fifth and said sixth parts having a second or third resistivity which is lower than said first resistivity, said first part and said second part being electrically connected in series by said first contact, said second part and said third part being electrically connected in series by said second contact, said third part and said fourth part being electrically connected in series by said third contact, and said fifth part and said sixth part being electrically connected in series by said fourth contact, a length of said plurality of first wires being the sum of a wire length of said first part from an end of said first component side of said first part up to said first contact, a length of said first contact, a wire length of said second part from said first contact up to said second contact, a length of said second contact, a wire length of said third part from said second contact up to said third contact, a length of said third contact, and a wire length of said fourth part from said third contact up to an end of said second component side of said fourth part, said plurality of first wires being arranged in odd numbered positions from a certain position in order from the shortest length, and a length of said plurality of second wires being the sum of a wire length of said fifth part from an end of said first component side of said fifth part up to said fourth contact, a length of said fourth contact, a wire length of said sixth part from said fourth contact up to an end of said second component side of said sixth part, said second wires being arranged in even numbered positions from said certain position in order from the longest length.

9. The semiconductor integrated circuit device according to claim 8, wherein said plurality of first wires being arranged in even numbered positions from said certain position in order from the shortest length and said plurality of second wires being arranged in odd numbered positions from said certain position in order from the longest length.

10. The semiconductor integrated circuit device according to claim 8, wherein said second part of said plurality of first wires are each formed on a first layer, and said first part and said third part of said first wires and said fifth part of said plurality of second wires are each formed on a second layer which is different to said first layer, and an end of said second component side of said first part and an end of said first component side of said second part each being connected via said first contact, and an end of said second component side of said second part and an end of said first component side of said third part each being connected via said second contact.

11. The semiconductor integrated circuit device according to claim 8, wherein said first component is a data buffer and said second component is an external input terminal.

12. The semiconductor integrated circuit device according to claim 8, wherein said first component is a data buffer and said second component is a sense amplifier.

13. The semiconductor integrated circuit device according to claim 8, wherein said first component is an ECC circuit and said second component is a buffer or a decoder.

14. The semiconductor integrated circuit device according to claim 8, wherein said first component is a memory cell array including a plurality of memory cells each of which is formed using a resistance change material on the intersections of one of a plurality of word lines and one of a plurality of bit lines, said word lines and said bit lines being mutually separated and intersect each other, said second component being a sense amplifier and said plurality of signal lines being said word lines.

* * * * *